US010001527B2

(12) United States Patent
Hase et al.

(10) Patent No.: US 10,001,527 B2
(45) Date of Patent: Jun. 19, 2018

(54) BATTERY-MONITORING SYSTEM AND IDENTIFYING-INFORMATION SETTING METHOD

(71) Applicant: KABUSHIKI KAISHA TOYOTA JIDOSHOKKI, Kariya-shi, Aichi (JP)

(72) Inventors: Ryusuke Hase, Kariya (JP); Takahiro Tsuzuku, Kariya (JP); Satoshi Yamamoto, Kariya (JP); Hiroaki Kato, Kariya (JP); Takuya Yamamoto, Kariya (JP)

(73) Assignee: KABUSHIKI KAISHA TOYOTA JIDOSHOKKI, Kariya-shi, Aichi (JP)

( * ) Notice: Subject to any disclaimer, the term of this patent is extended or adjusted under 35 U.S.C. 154(b) by 304 days.

(21) Appl. No.: 14/780,577

(22) PCT Filed: Jan. 30, 2014

(86) PCT No.: PCT/JP2014/052043
§ 371 (c)(1),
(2) Date: Sep. 28, 2015

(87) PCT Pub. No.: WO2014/162765
PCT Pub. Date: Oct. 9, 2014

(65) Prior Publication Data
US 2016/0054393 A1 Feb. 25, 2016

(30) Foreign Application Priority Data
Apr. 4, 2013 (JP) .................................. 2013-078427

(51) Int. Cl.
*H02J 7/00* (2006.01)
*G01N 27/416* (2006.01)
(Continued)

(52) U.S. Cl.
CPC ........ *G01R 31/3679* (2013.01); *B60L 3/0084* (2013.01); *B60L 3/12* (2013.01);
(Continued)

(58) Field of Classification Search
USPC ................................. 324/124, 434; 320/121
See application file for complete search history.

(56) References Cited

U.S. PATENT DOCUMENTS 8,432,132 B2 * 4/2013 Nakanishi ............. H02J 7/0016
320/116
2010/0182154 A1 7/2010 Kawai et al.
(Continued)

FOREIGN PATENT DOCUMENTS

CN 101548192 A 9/2009
EP 2081038 A1 7/2009
(Continued)

OTHER PUBLICATIONS

International Search Report for PCT/JP2014/052043 dated Apr. 15, 2014.
(Continued)

*Primary Examiner* — Farhana Hoque
(74) *Attorney, Agent, or Firm* — Sughrue Mion, PLLC (57) ABSTRACT

Each of a plurality of monitoring units (10) that monitor the states of batteries allocates, as identifying information for itself, identifying information corresponding to an input signal inputted from a preceding control unit (3) or monitoring unit (10); outputs, to a subsequent monitoring unit (10), a signal that differs from the input signal corresponding to the identifying information the monitoring unit (10) in question has allocated to itself; and, if and when identifying information corresponding to an input signal differs from the identifying information the monitoring unit (10) in question had allocated to itself, reallocates identifying information
(Continued)

corresponding to said input signal as identifying information for itself.

12 Claims, 5 Drawing Sheets

(51) Int. Cl.
| | |
|---|---|
| *G01R 31/36* | (2006.01) |
| *B60L 3/00* | (2006.01) |
| *B60L 3/12* | (2006.01) |
| *B60L 11/18* | (2006.01) |
| *H01M 10/48* | (2006.01) |
| *H04L 29/12* | (2006.01) |

(52) U.S. Cl.
CPC ....... *B60L 11/1861* (2013.01); *B60L 11/1864* (2013.01); *G01R 31/3658* (2013.01); *H01M 10/482* (2013.01); *H04L 61/2038* (2013.01); *H04L 61/2092* (2013.01); *B60L 2240/545* (2013.01); *B60L 2240/547* (2013.01); *B60L 2240/549* (2013.01); *G01R 31/3606* (2013.01); *Y02T 10/7005* (2013.01); *Y02T 10/7044* (2013.01); *Y02T 10/7061* (2013.01)

(56) References Cited

U.S. PATENT DOCUMENTS

| | | | |
|---|---|---|---|
| 2011/0080138 | A1 | 4/2011 | Nakanishi |
| 2011/0175574 | A1* | 7/2011 | Sim ..................... H01M 10/425 |
| | | | 320/121 |
| 2011/0215810 | A1 | 9/2011 | Murakami |
| 2011/0273023 | A1 | 11/2011 | Nishida et al. |
| 2012/0133370 | A1 | 5/2012 | Kubo et al. |
| 2013/0193925 | A1 | 8/2013 | Abe et al. |
| 2015/0244191 | A1* | 8/2015 | Matsumura ........... H02J 7/0021 |
| | | | 320/116 |

FOREIGN PATENT DOCUMENTS

| | | |
|---|---|---|
| JP | 2006-268254 A | 10/2006 |
| JP | 2010-146991 A | 7/2010 |
| JP | 2011-181392 A | 9/2011 |
| WO | 2010/067724 A1 | 6/2010 |
| WO | 2012/124233 A1 | 9/2012 |

OTHER PUBLICATIONS

Communication dated Aug. 24, 2016, from the European Patent Office in counterpart European application No. 14779035.6.

* cited by examiner

| INPUT SIGNAL (DUTY RATIO) | IDENTIFYING INFORMATION | OUTPUT SIGNAL (DUTY RATIO) |
|---|---|---|
| 10% | 101 | 20% |
| 20% | 102 | 30% |
| 30% | 103 | 40% |
| 40% | 104 | 50% |
| 50% | 105 | — |

BATTERY-MONITORING SYSTEM AND IDENTIFYING-INFORMATION SETTING METHOD

CROSS REFERENCE TO RELATED APPLICATIONS

This application is a National Stage of International Application No. PCT/JP2014/052043 filed Jan. 30, 2014, claiming priority based on Japanese Patent Application No. 2013-078427 filed Apr. 4, 2013, the contents of all of which are incorporated herein by reference in their entirety.

TECHNICAL FIELD

The present invention discussed herein is related to a technology for monitoring states of a plurality of batteries.

BACKGROUND ART

In recent years, batteries that are obtained by connecting a plurality of batteries in parallel in order to stably supply to a load a large amount of power have been mounted on vehicles such as electric forklift trucks, hybrid vehicles, or electric vehicles.

In addition, some battery-monitoring systems that monitor the state of each battery include control units that allow charging and discharging of each battery according to the monitoring result of each battery. In such a battery-monitoring system, the control unit requires identifying information that is individually allocated to each of a plurality of monitoring units that monitor the states of the batteries in order to obtain the monitoring result from each monitoring unit.

In a case in which positions of two of the batteries are swapped or at least one of the batteries is replaced with a new battery, when identifying information for the monitoring unit that corresponds to the battery after swapping or after replacement has been changed, the monitoring unit that corresponds to the battery after swapping or after replacement cannot communicate normally with the control unit.

Therefore, resetting of the identifying information for the monitoring unit that corresponds to the battery after swapping or after replacement is required (For example, see Patent documents 1 and 2).

CITATION LIST

Patent Literature

[Patent Document 1] Japanese Laid-open Patent Publication No. 2006-268254
[Patent Document 2] Japanese Laid-open Patent Publication No. 2011-181392

SUMMARY OF INVENTION

Technical Problem

However, in a case in which all the monitoring units are connected in series, that is, are daisy-chain connected, even when in-between monitoring units have been swapped or an in-between monitoring unit is replaced, identifying information for all the monitoring units has to be reset, and therefore there is concern that resetting of identifying information will require a lot of time and trouble.

Therefore, the present invention aims to provide a battery-monitoring system and an identifying-information setting method that enable easy resetting of identifying information for a monitoring unit in a case in which monitoring units that monitor states of batteries that are connected in parallel are connected in series.

Solution to Problem

The battery-monitoring system of the present invention includes a plurality of monitoring units to monitor the states of batteries, and a control unit to communicate with the plurality of monitoring units by using identifying information that has been allocated to each of the plurality of monitoring units that are connected in series.

Each of the plurality of monitoring units allocates as identifying information for itself identifying information that corresponds to a first signal that has been output from a preceding control unit or monitoring unit, outputs to a subsequent monitoring unit a second signal that differs from the first signal that corresponds to the identifying information that the monitoring unit in question has allocated to itself, and in a case in which identifying information that corresponds to the first signal differs from the identifying information that the monitoring unit in question has allocated to itself, reallocates identifying information that corresponds to the first signal as identifying information for itself.

Thus, in a case in which an in-between monitoring unit among the plurality of monitoring units that are connected in series is replaced with a new monitoring unit, since a resetting of identifying information for subsequent monitoring units in addition to identifying information for the new monitoring unit is required, resetting of identifying information for the monitoring units may be performed in an easier way in comparison with the case of resetting identifying information for all the monitoring units after replacement of the monitoring unit.

Advantageous Effects of Invention

According to the present invention, in a case in which monitoring units that monitor the states of batteries that are connected in parallel are connected in series, resetting of identifying information for the monitoring unit may be easily performed.

DESCRIPTION OF EMBODIMENTS

Figure 1:
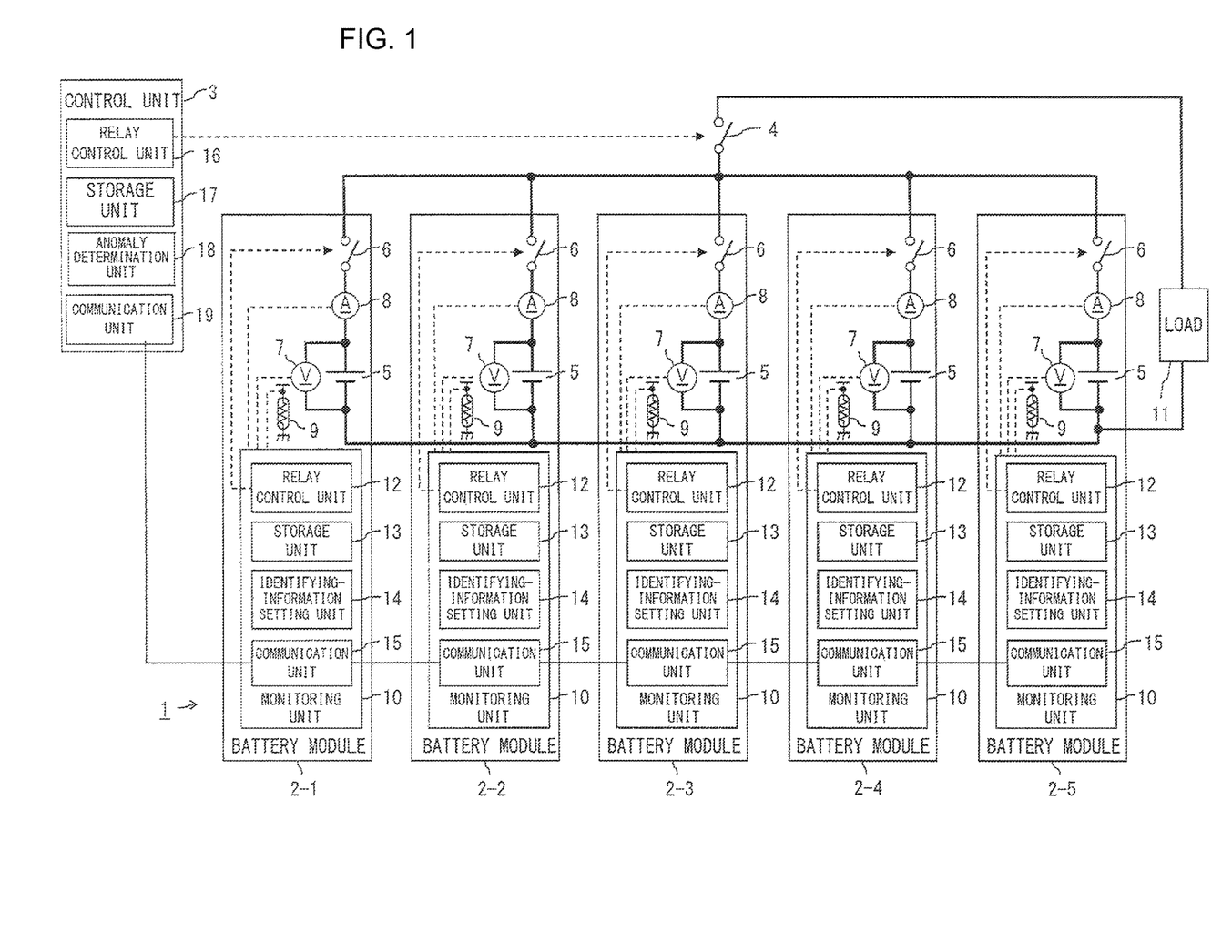
FIG. 1 is a diagram illustrating a battery-monitoring system of an embodiment.

FIG. 1 is a diagram illustrating a battery-monitoring system of an embodiment.

The battery-monitoring system 1 illustrated in FIG. 1 includes a plurality of battery modules 2 (2-1 to 2-5), a control unit (battery ECU) 3, and a main relay 4. Note that the battery-monitoring system 1 is mounted on a vehicle such as an electric forklift truck, a hybrid vehicle, or an electric vehicle. In addition, the number of battery modules 2 is not limited to 5.

Each of the battery modules 2-1 to 2-5 includes a battery 5, a relay 6, a voltage detection unit 7, a current detection unit 8, a temperature detection unit 9, and a monitoring unit (monitoring ECU) 10.

The battery 5 is a rechargeable battery, and is, for example, a lithium-ion secondary battery or a nickel hydride battery. The battery 5 may be configured by including a plurality of batteries that are connected in series. The batteries 5 are connected in parallel and supply power to a load 11.

The relay 6 is provided between the main relay 4 and the battery 5. When the main relay 4 is turned on while the relay 6 is on, power may be supplied from the battery 5 to the load 11.

The voltage detection unit 7 detects the voltage of the battery 5 and is, for example, a voltmeter.

The current detection unit 8 detects a current that flows to the battery 5 during charging and a current that flows from the battery 5 during discharging, and is, for example, an ammeter.

The temperature detection unit 9 detects ambient temperature of the battery 5, and is, for example, a thermistor.

The monitoring unit 10 includes a relay control unit 12, a storage unit 13, an identifying-information setting unit 14, and a communication unit 15. Note that the relay control unit 12, the identifying-information setting unit 14, and the communication unit 15 are configured, for example, by using a CPU (Central Processing Unit), a multi-core CPU, a programmable device (FPGA (Field Programmable Gate Array), PLD (Programmable Logic Device), etc.) and are realized by reading and executing by the CPU, the programmable device, or the PLD a program that has been stored in the storage unit 13.

The relay control unit 12 controls on and off of the relay 6.

The storage unit 13 is, for example, a ROM (Read Only Memory) or a RAM (Random Access Memory), and stores various pieces of information and various programs.

The identifying-information setting unit 14 sets identifying information for itself and causes the storage unit 13 to store therein the identifying information. For example, in a case in which five pieces of identifying information, "101", "102", "103", "104", and "105" are allocated to the battery modules 2-1 to 2-5, respectively, the identifying-information setting unit 14 of the leading battery module 2-1 allocates "101" as identifying information for itself and causes the storage unit 13 to store therein the information. The identifying-information setting unit 14 of the battery module 2-2 that is arranged subsequent to the battery module 2-1 allocates "102" as identifying information for itself and causes the storage unit 13 to store therein the information. The identifying-information setting unit 14 of the battery module 2-3 that is arranged subsequent to the battery module 2-2 allocates "103" as identifying information for itself and causes the storage unit 13 to store therein the information. The identifying-information setting unit 14 of the battery module 2-4 that is arranged subsequent to the battery module 2-3 allocates "104" as identifying information for itself and causes the storage unit 13 to store therein the information. The identifying-information setting unit 14 of the battery module 2-5 that is arranged subsequent to the battery module 2-4 allocates "105" as identifying information for itself and causes the storage unit 13 to store therein the information.

The communication unit 15 inputs (receives) a signal that has been output (transmitted) from the preceding control unit 3 or the preceding monitoring unit 10 and outputs (transmits) a signal to the subsequent monitoring unit 10.

The control unit 3 includes a relay control unit 16 that controls on and off of the main relay 4, a storage unit 17, an abnormity determination unit 18, and a communication unit 19 that communicates with the monitoring units 10 of the battery modules 2-1 to 2-5. Note that the storage unit 17 is, for example, a ROM or a RAM, and stores various pieces of information and various programs. The relay control unit 16, the abnormity determination unit 18, and the communication unit 19 are configured, for example, by using a CPU, a multi-core CPU, and a programmable device (FPGA, PLD, etc.), and are realized by reading and executing by the CPU, the programmable device, or the PLD a program that has been stored in the storage unit 17. When the control unit 3 receives by means of the communication unit 19 identifying information that has been transmitted from each of the battery modules 2-1 to 2-5, the control unit 3 causes the storage unit 17 to store therein identifying information in association with the order of the battery modules 2-1 to 2-5. The control unit 3 uses the identifying information that has been stored in the storage unit 17 so as to receive by means of the communication unit 19 information that has been transmitted from each of the battery modules 2-1 to 2-5 and that indicates the state of the battery 5 (for example, the voltage, current, and temperature of the battery 5). When the state of the battery 5 that is indicated in the received information falls under a condition that has been specified in advance (for example, when at least one of the voltage, current, and temperature of the battery 5 is higher than a threshold), the control unit 3 judges that the state of at least one battery 5 among the batteries 5 of the battery modules 2-1 to 2-5 is anomalous, and transitions to an evacuation running mode (for example, a process for transmitting to a host control unit that controls the travel of the vehicle an instruction to gradually decelerate and stop the vehicle within a fixed time period and turning off the main relay 4 by means of the relay control unit 16 after a fixed time has passed). In a case in which at least one piece of identifying information among the pieces of identifying information that have been transmitted from the battery modules 2-1 to 2-5 has already been stored in the storage unit 17 and at the same time the main relay 4 is turned on, the control unit 3 judges that swapping or replacement of the battery modules 2-1 to 2-5 has been performed when power is supplied from the battery 5 to the load 11, and transitions to the evacuation running mode. In a case in which at least one battery module 2 among the battery modules 2-1 to 2-5 transmits information indicating that a communication abnormity has occurred, the control unit 3 transitions to the evacuation running mode.

The control unit 3 and the monitoring units 10 of the battery modules 2-1 to 2-5 are connected in series via the communication units 15 and 19, which is referred to as daisy chain connection.

Note that signals that are used for setting identifying information are not limited to square waves whose duty ratios are varied; however, in a case in which identifying information is set according to the duty ratio of a square wave in the same manner as above, configuration of the communication unit 15 may be made simpler in comparison with that in the case of setting identifying information by using a signal that requires a complicated process such as a modulation process or an encoding process.

The identifying-information setting unit 14 of each of the battery modules 2-1 to 2-5 may set identifying information by using the frequency of an input signal or the number of pulses of an input signal per unit time. In addition to a square wave, a numerical value or character information may be used as a signal that is used for setting identifying information.

When a communication line that interconnects the control unit 3 and the monitoring units 10 of the battery modules 2-1 to 2-5 is not used in an identifying-information setting process, the communication line may be used for transmitting to the control unit 3 information indicating that a communication abnormity has occurred.

Figure 2:
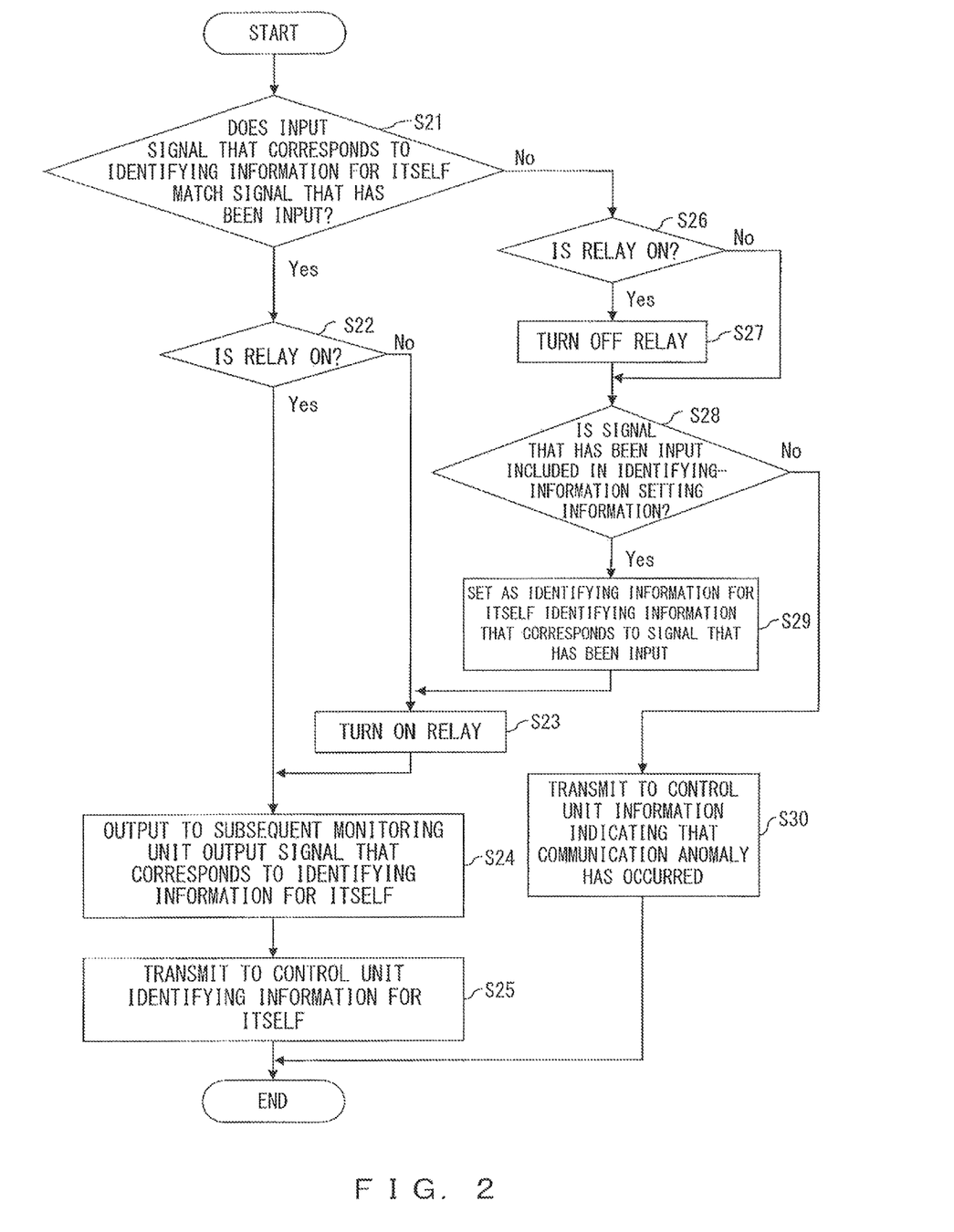
FIG. 2 is a flowchart illustrating operations of a monitoring unit.

FIG. 2 is a flowchart illustrating operations of the monitoring unit 10.

First, when identifying-information setting timing has come, the identifying-information setting unit 14 of the monitoring unit 10 refers to information that is stored in the storage unit 13 and is obtained by associating an input signal, identifying information, and an output signal with one another (hereinafter referred to as identifying-information setting information), acquires an input signal that corresponds to identifying information for itself that has been stored in the storage unit 13, and judges whether or not the acquired input signal and a signal that has been input to the communication unit 15 for itself match with each other (S21). Note that the identifying information setting timing is set, for example, at fixed time intervals after initial setting, or when the communication line is connected to a communication connector of the communication unit 15 for itself due to swapping or replacement of the battery module 2. Operations in the initial setting of identifying information will be described later. Note that judgment on matching is not limited to making a judgment by comparing input signals. The identifying-information setting unit 14 may acquire with reference to the identifying-information setting information identifying information for itself that has been stored in the storage unit 13 and identifying information that corresponds to the signal that has been input to the communication unit 15 for itself, may compare both pieces of identifying information with each other, and may judge whether or not they match with each other.

Next, in a case in which the identifying-information setting unit 14 judges that the input signal that corresponds to the identifying information for itself and the signal that has been input to the communication unit 15 match with each other (Yes in S21), when the relay 6 is not turned on (No in S22), the identifying-information setting unit 14 turns on the relay 6 by means of the relay control unit 12 (S23).

Next, when the relay 6 is in an on-state (Yes in S22, or S23), the identifying-information setting unit 14 refers to the identifying-information setting information, acquires an output signal that corresponds to the identifying information for itself, outputs to the subsequent monitoring unit 10 the acquired output signal (S24), and thereafter transmits to the control unit 3 the identifying information for itself (S25), and terminates the identifying-information setting process.

In a case in which the identifying-information setting unit 14 judges that the input signal that corresponds to the identifying information for itself and the signal that has been input to the communication unit 15 do not match with each other (No in S21), when the relay 6 is turned on (Yes in S26), the identifying-information setting unit 14 turns off the relay 6 by means of the relay control unit 12.

Next, when the relay 6 is in an off-state (No in S26, or S27) and at the same time the signal that has been input to the communication unit 15 of the monitoring unit 10 in question is included in the identifying-information setting information (Yes in S28), the identifying-information setting unit 14 causes the storage unit 13 to store therein as identifying information for itself identifying information that corresponds to the signal (S29), and thereafter turns on the relay 6 by means of the relay control unit 12 (S23). In regard to subsequent operations, as described above, the identifying-information setting unit 14 refers to the identifying-information setting information, acquires an output signal that corresponds to the identifying information for itself, outputs to the subsequent monitoring unit 10 the acquired output signal (S24), and thereafter transmits to the control unit 3 the identifying information for itself (S25), and terminates the identifying-information setting process.

When the signal that has been input to the communication unit 15 is not included in the identifying-information setting information (No in S28), the identifying-information setting unit 14 transmits to the control unit 3 information indicating that a communication abnormity has occurred (S30).

Figure 3:
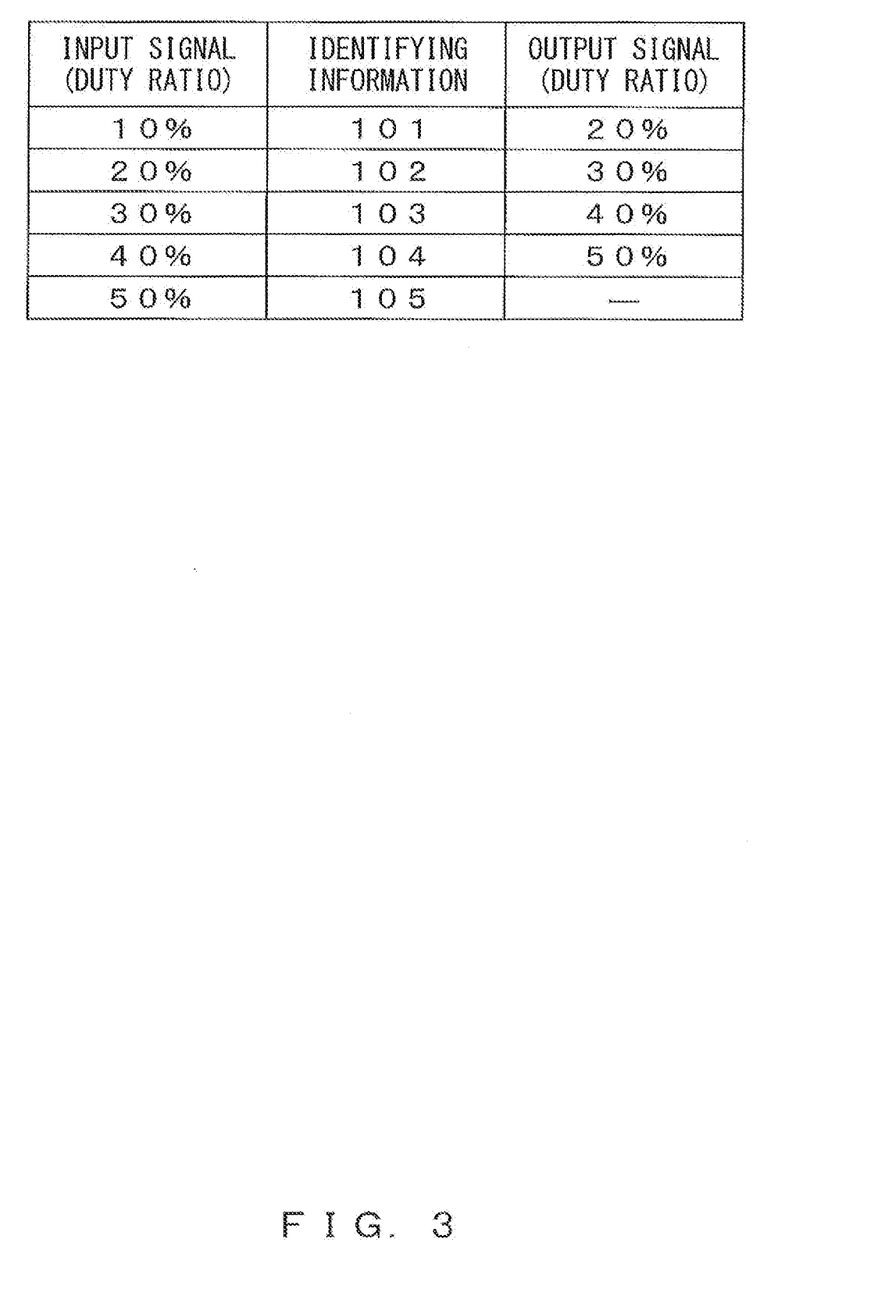
FIG. 3 is a diagram illustrating an example of information that is stored in a storage unit.

For example, at the initial setting of identifying information, when the duty ratio of a square wave as a signal that has been output from the control unit 3 and has been input to the communication unit 15 of the battery module 2-1 is "10%", the battery module 2-1 refers to the identifying-information setting information illustrated in FIG. 3, acquires identifying information ("101") that corresponds to the "10%", causes the storage unit 13 to store therein the identifying information ("101") as identifying information for itself, and thereafter turns on the relay 6 by means of the relay control unit 12. Then, the battery module 2-1 refers to the identifying-information setting information illustrated in FIG. 3, acquires duty ratio "20%" of a square wave as an output signal that corresponds to the identifying information ("101") for itself, outputs to the monitoring unit 10 of the subsequent battery module 2-2 the square wave of the acquired duty ratio "20%", and thereafter transmits to the control unit 3 the identifying information ("101") for itself. At the initial setting of identifying information, when the duty ratio of a square wave as a signal that has been output from the battery module 2-1 and has been input to the communication unit 15 of the battery module 2-2 is "20%", the battery module 2-2 refers to the identifying-information setting information illustrated in FIG. 3, acquires identifying information ("102") that corresponds to the duty ratio "20%", causes the storage unit 13 to store therein the identifying information ("102") as identifying information for itself, and thereafter turns on the relay 6 by means of the relay control unit 12. Then, the battery module 2-2 refers to the identifying-information setting information illustrated in FIG. 3, acquires duty ratio "30%" of a square wave as an output signal that corresponds to the identifying information ("102") for itself, outputs to the monitoring unit 10 of the subsequent battery module 2-3 the square wave of the acquired duty ratio "30%", and thereafter transmits to the control unit 3 the identifying information ("102") for itself. At the initial setting of identifying information, when the duty ratio of a square wave as a signal that has been output from the battery module 2-2 and has been input to the communication unit 15 of the battery module 2-3 is "30%", the battery module 2-3 refers to the identifying-information setting information illustrated in FIG. 3, acquires identifying information ("103") that corresponds to the duty ratio "30%", causes the storage unit 13 to store therein the identifying information ("103") as identifying information for itself, and thereafter turns on the relay 6 by means of the relay control unit 12. Then, the battery module 2-3 refers to the identifying-information setting information illustrated in FIG. 3, acquires duty ratio "40%" of a square wave as an output signal that corresponds to the identifying information ("103") for itself, outputs to the monitoring unit 10 of the subsequent battery module 2-4 the signal of the acquired duty ratio "40%", and thereafter transmits to the control unit 3 the identifying information ("103") for itself. At the initial setting of identifying information, when the duty ratio of a square wave as a signal that has been output from the battery module 2-3 and has been input to the communication unit 15 of the battery module 2-4 is "40%", the battery module 2-4 refers to the identifying-information setting information illustrated in FIG. 3, acquires identifying information ("104") that corresponds to the duty ratio "40%", causes the storage unit 13 to store therein the identifying information ("104") as the identifying information for itself, and thereafter turns on the relay 6 by means of the relay control unit 12. Then, the battery module 2-4 refers to the identifying-information setting information illustrated in FIG. 3, acquires duty ratio "50%" of a square wave as an output signal that corresponds to the identifying information ("104") for itself, outputs to the monitoring unit 10 of the subsequent battery module 2-5 the signal of the acquired duty ratio "50%", and thereafter transmits to the control unit 3 the identifying information ("104") for itself. At the initial setting of identifying information, when the duty ratio of a square wave as a signal that has been output from the battery module 2-4 and has been input to the communication unit 15 of the battery module 2-5 is "50%", the battery module 2-5 refers to the identifying-information setting information illustrated in FIG. 3, acquires identifying information ("105") that corresponds to the duty ratio "50%", causes the storage unit 13 to store therein the identifying information ("105") as identifying information for itself, and thereafter turns on the relay 6 by means of the relay control unit 12, and transmits to the control unit 3 the identifying information ("105") for itself.

Thus, in comparison with the case of setting identifying information by transmitting and receiving numerical information, the configuration of the monitoring unit 10 may be made simpler because it is possible to set identifying information only by transmitting and receiving signals whose duty ratios have been varied. The control unit 3 may recognize the number of connected monitoring units 10 by receiving identifying numbers from the monitoring units 10.

For example, in a case in which the battery module 2-4 whose identifying information is "104" is replaced with a new battery module 2 whose identifying information is "102", when the identifying-information setting timing has come, the identifying-information setting unit 14 of the battery module 2 after replacement refers to the identifying-information setting information illustrated in FIG. 3 and acquires "20%" as the duty ratio of a square wave as an input signal that corresponds to "102", which is the identifying information for itself. Next, when the identifying-information setting unit 14 judges that the acquired duty ratio "20%" and the duty ratio "40%" of a signal that has been input to the communication unit 15 for itself do not match with each other, if the relay 6 is not turned off, the identifying-information setting unit 14 turns off the relay 6 by means of the relay control unit 12. Next, the identifying-information setting unit 14 refers to the identifying-information setting information illustrated in FIG. 3, acquires "104" as identifying information that corresponds to the duty ratio "40%" of the signal that has been input to the communication unit 15, causes the storage unit 13 to store therein the acquired identifying information ("104") as identifying information for itself, and thereafter turns on the relay 6 by means of the relay control unit 12. Then, the identifying-information setting unit 14 refers to the identifying-information setting information illustrated in FIG. 3, acquires "50%" as the duty ratio of a square wave as an output signal that corresponds to "104", which is the identifying information for itself, outputs to the monitoring unit 10 of the subsequent battery module 2-5 the square wave of the acquired duty ratio 50%, and thereafter transmits to the control unit 3 "104" as the identifying information for itself, and terminates an identifying-information resetting process. Note that when the battery module 2-4 is replaced with a new battery module 2, the identifying-information setting unit 14 of the subsequent battery module 2-5 might set wrong identifying information according to a signal before a resetting that has been transmitted from the new battery module 2. In such a case, after a resetting of the identifying information for the new battery module 2 has been completed, the identifying information for the subsequent battery module 2-5 is set again.

For example, in a case in which a signal of duty ratio "100%" or a signal of duty ratio "0%" has been input from the communication unit 15 of the battery module 2-3 to the communication unit 15 of the battery module 2-4 because the communication unit 15 of the battery module 2-3 becomes anomalous or the communication line is extracted from a communication connector of the communication unit 15 of the battery module 2-3, the identifying-information setting unit 14 of the battery module 2-4 judges that the input signal of duty ratio "100%" or the input signal of the duty ratio "0%" is not included in the identifying-information setting information illustrated in FIG. 3 and transmits to the control unit 3 information indicating that a communication abnormity has occurred.

Figure 4:
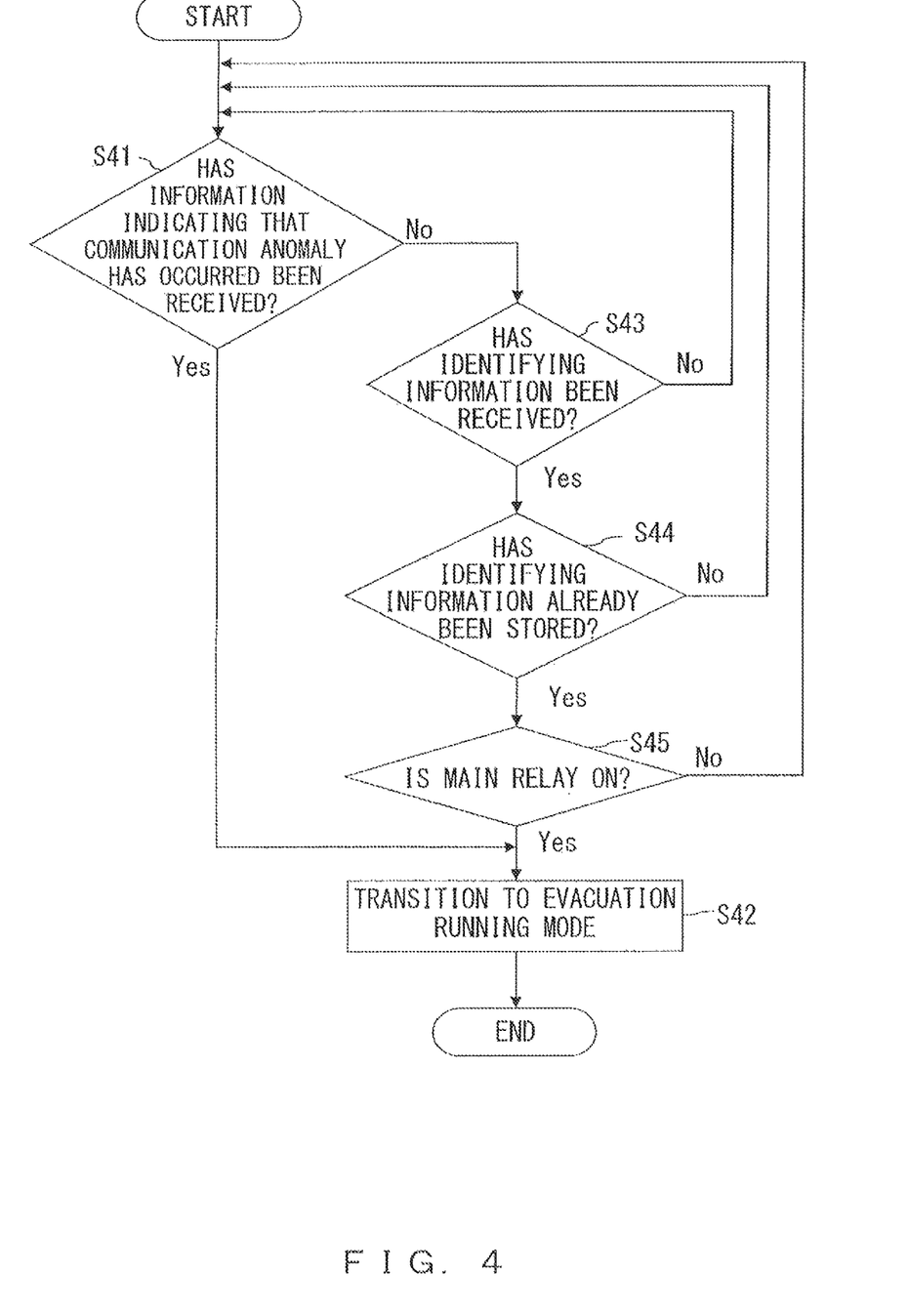
FIG. 4 is a flowchart illustrating operations of a control unit.

FIG. 4 is a flowchart illustrating operations of the control unit 3.

First, when the abnormity determination unit 18 of the control unit 3 receives from at least one battery module 2 among the battery modules 2-1 to 2-5 information indicating that a communication abnormity has occurred (Yes in S41), the abnormity determination unit 18 transitions to the evacuation running mode (S42). In addition, when the abnormity determination unit 18 receives identifying information from the battery modules 2-1 to 2-5 (No in S41 and Yes in S43), if at least one piece of the received identifying information has already been stored in the storage unit 17 (Yes in S44) and the main relay 4 is turned on (Yes in S45), the abnormity determination unit 18 transitions to the evacuation running mode (S42). Thus, in a case in which a communication abnormity occurs and in a case in which the battery module 2 has been replaced while the battery 5 is being used, the mode may transition to the evacuation running mode and thus safety of the vehicle may be enhanced.

As described, according to the battery-monitoring system 1 of the embodiment, each of the monitoring units 10 of the battery modules 2-1 to 2-5 allocates as identifying information for itself identifying information that corresponds to an input signal that has been input from the preceding control unit 3 or monitoring unit 10, outputs to the subsequent monitoring unit 10 an output signal that differs from the input signal that corresponds to the identifying information that the monitoring unit 10 in question has allocated to itself, and in a case in which identifying information that corresponds to an input signal differs from the identifying information that the monitoring unit 10 in question has allocated to itself, reallocates the identifying information that corresponds to the input signal as identifying information for itself. Thus, in a case in which the battery module 2-4 among the battery modules 2-1 to 2-5 is replaced with a new battery module 2, since it is only necessary to reset the identifying information for the new battery module 2 or to reset the identifying information for the subsequent battery module 2-5 in addition to the identifying information for the new battery module 2, the identifying information may be reset in an easier way in comparison with the case of resetting the identifying information for all the battery modules 2-1 to 2-5 after replacement of the battery module 2-4.

Figure 5:
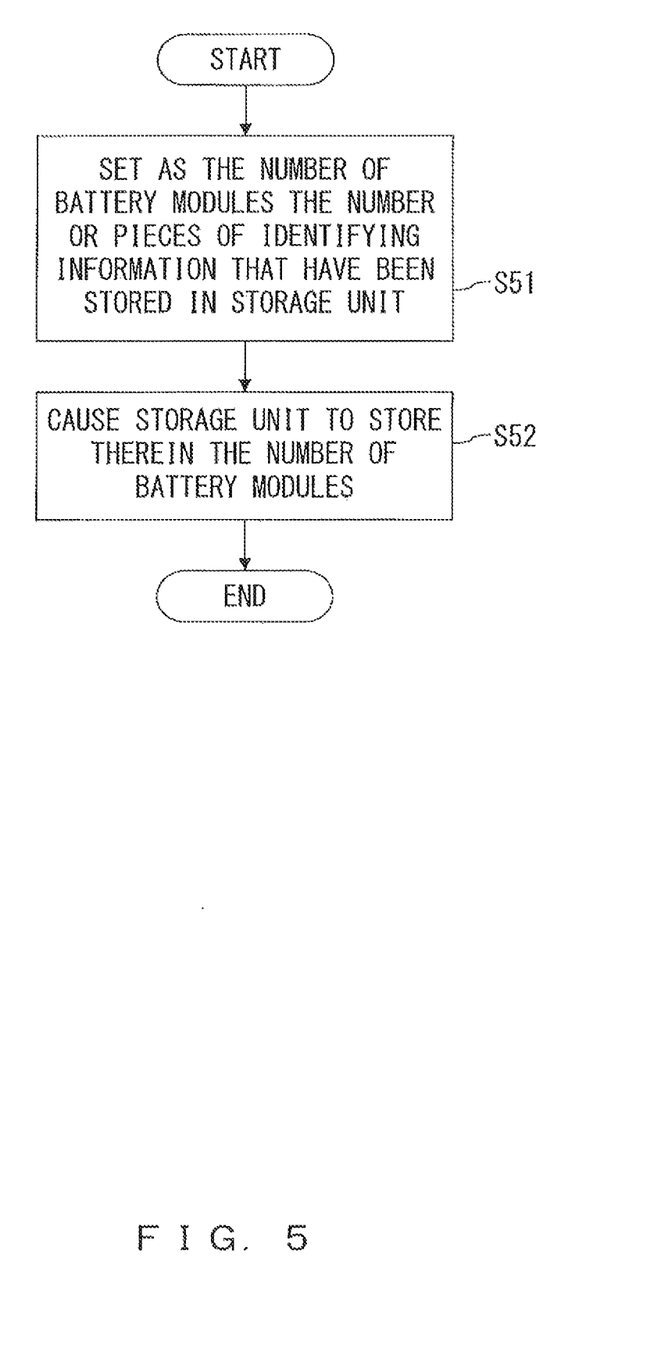
FIG. 5 is a flowchart illustrating operations of the control unit.

FIG. 5 is a flowchart illustrating operations of the control unit 3 for confirming the number of battery modules 2. Note that, as described above, it is assumed that when the control unit 3 receives identifying information that has been transmitted from each of the battery modules 2-1 to 2-5, the control unit 3 causes the storage unit 17 to store therein the identifying information.

For example, when a time specified in advance has come or when an instruction to confirm the number of battery modules 2 has been input from outside, the control unit 3 sets as the number of battery modules 2 the number of pieces of identifying information that have been stored in the storage unit 17 (S51), and causes the storage unit 17 to store therein the number of battery modules 2 (S52).

Note that the control unit 3 may set as the number of monitoring units 10 the number of pieces of identifying information that have been stored in the storage unit 17.

In addition, the control unit 3 may obtain the number of battery modules 2 by obtaining the number of monitoring units 10 and thereafter dividing the number of monitoring units 10 by the number of monitoring units 10 that are provided in each battery module 2. In this case, even when a plurality of monitoring units 10 are provided in one battery module 2, the number of battery modules 2 may be obtained.

Consequently, even when the number of battery modules 2 or the number of monitoring units 10 is changed in order to increase or decrease the overall capacity of the batteries 5 that are connected in parallel, the control unit 3 may grasp the number of battery modules 2 or the number of monitoring units 10. Thus, it is not necessary to change constants of the program according to the change in the number of battery modules 2 or the number of monitoring units 10 nor is it necessary to prepare another program. Therefore, it is possible to suppress an increase in management cost and an increase in manufacturing cost.

EXPLANATION OF THE CODES

1 Battery-monitoring system
2-1 to 2-5 Battery module
3 Control unit
4 Main relay
5 Battery
6 Relay
7 Voltage detection unit
8 Current detection unit
9 Temperature detection unit
10 Monitoring unit
11 Load
12 Relay control unit
13 Storage unit
14 Identifying-information setting unit
15 Communication unit
16 Relay control unit
17 Storage unit
18 Abnormity determination unit
19 Communication unit

The invention claimed is:

1. A battery-monitoring device comprising:
   a first monitoring unit and a second monitoring unit to monitor states of batteries; and
   a control unit to communicate with the first monitoring unit by using first identifying information that has been allocated to the first monitoring unit, and to communicate with the second monitoring unit by using second identifying information that has been allocated to the second monitoring unit, wherein
   the first monitoring unit includes a first communication unit and a first storage unit that stores setting information obtained by associating a first input signal and the first identifying information with one another,
   the second monitoring unit includes a second storage unit that stores the setting information, and a second communication unit connected in series to the first communication unit,
   the control unit includes a third storage unit and a third communication unit connected in series to the first communication unit,
   when the first input signal, that has been output from the third communication unit, has been input to the first communication unit, the first monitoring unit refers to the setting information, and allocates, in the first storage unit and as the first identifying information for itself, the first identifying information that corresponds to the first input signal that has been output from the third communication unit,
   the first monitoring unit outputs, to the second communication unit of the second monitoring unit, a second input signal that differs from the first input signal that has been output from the third communication unit,
   in a first case in which the first monitoring unit judges that the first identifying information, that corresponds to the first input signal that has been output from the third communication unit, differs from the first identifying information that the first monitoring unit has allocated to itself, the first monitoring unit reallocates, as the first identifying information for itself, the first identifying information that corresponds to the first input signal that has been output from the third communication unit,
   when the second input signal, that has been output from the first communication unit, has been input to the second communication unit, the second monitoring unit refers to the setting information, and allocates, in the second storage unit and as the second identifying information for itself, the second identifying information that corresponds to the second input signal that has been output from the first communication unit, and
   in a second case in which the second monitoring unit judges that the second identifying information, that corresponds to the second input signal that has been output from the first communication unit, differs from the second identifying information that the second monitoring unit has allocated for itself, the second monitoring unit reallocates, as the second identifying information for itself, the second identifying information that corresponds to the second input signal that has been output from the first communication unit.

2. The battery-monitoring device according to claim 1, wherein the control unit:
   judges that in a third case in which the first identifying information that has been output from the first monitoring unit has already been stored in the third storage unit, swapping or replacement of the first monitoring unit has already been performed, and judges that in a fourth case in which the second identifying information that has been output from the second monitoring unit has already been stored in the third storage unit, swapping or replacement of the second monitoring unit has already been performed.

3. The battery-monitoring device according to claim 2, wherein:

the setting information associates a first duty ratio of the first input signal and the first identifying information, and associates a second duty ratio of the second input signal and the second identifying information;

when the first input signal, that has been output from the third communication unit, has been input to the first communication unit, the first monitoring unit refers to the setting information, and allocates, as the first identifying information for itself, the first identifying information that corresponds to the first duty ratio of the first input signal, the first monitoring unit outputs, to the second monitoring unit, the second input signal of the second duty ratio that differs from the first duty ratio of the first input signal that has been output from the third communication unit, in a fifth case in which the first monitoring unit judges that the first identifying information, that corresponds to the first duty ratio of the first input signal that has been output from the third communication unit, differs from the first identifying information that the first monitoring unit has allocated to itself, the first monitoring unit reallocates, as the first identifying information for itself, the first identifying information that corresponds to the first duty ratio of the first input signal that has been output from the third communication unit, when the second input signal, that has been output from the first communication unit, has been input to the second communication unit, the second monitoring unit refers to the setting information, and allocates, as the second identifying information for itself, the second identifying that corresponds to the second duty ratio of the second input signal that has been output from the first communication unit, and in a sixth case in which the second monitoring unit judges that the second identifying information, that corresponds to the second duty ratio of the second input signal that has been output from the first communication unit, differs from the second identifying information that the second monitoring unit has allocated to itself, the second monitoring unit reallocates, as the second identifying information for itself, the second identifying information that corresponds to the second duty ratio of the second input signal that has been output from the first communication unit.

4. The battery-monitoring device according to claim 1, wherein:

the setting information associates a first duty ratio of the first input signal and the first identifying information with one another, and associates a second duty ratio of the second input signal and the second identifying information with one another, when the first input signal, that has been output from the third communication unit, has been input to the first communication unit, the first monitoring unit refers to the setting information, and allocates, as the first identifying information for itself, the first identifying information that corresponds to the first duty ratio of the first input signal, the first monitoring unit outputs, to the second monitoring unit, the second input signal of the second duty ratio that differs from the first duty ratio of the first input signal that has been output from the third communication unit, in a third case in which the first monitoring unit judges that the first identifying information, that corresponds to the first duty ratio of the first input signal that has been output from the third communication unit, differs from the first identifying information that the first monitoring unit has allocated to itself, the first monitoring unit reallocates, as the first identifying information for itself, the first identifying information that corresponds to the first duty ratio of the first input signal that has been output from the third communication unit, when the second input signal, that has been output from the first communication unit, has been input to the second communication unit, the second monitoring unit refers to the setting information, and allocates, as the second identifying information for itself, the second identifying information that corresponds to the second duty ratio of the second input signal that has been output from the first communication unit, and in a fourth case in which the second monitoring unit judges that the second identifying information, that corresponds to the second duty ratio of the second input signal that has been output form the first communication unit, differs from the second identifying information that the second monitoring unit has allocated to itself, the second monitoring unit reallocates, as the second identifying information for itself, the second identifying information that corresponds to the second duty ratio of the second input signal that has been output from the first communication unit.

5. The battery-monitoring device according to claim 1, wherein:

the setting information associates a first frequency of the first input signal and the first identifying information with one another, and associates a second frequency and the second identifying information with one another, when the first input signal, that has been output from the third communication unit, has been input to the first communication unit, the first monitoring unit refers to the setting information, and allocates, as the first identifying for itself, the first identifying information that corresponds to the first frequency of the first input signal, the first monitoring unit outputs, to the second monitoring unit, the second input signal of the second frequency that differs from the first frequency of the first input signal that has been output from the third communication unit, in a third case in which the first identifying information, that corresponds to the first frequency of the first input signal that has been output from the third communication unit, differs from the first identifying information that the first monitoring unit has allocated to itself, the first monitoring unit reallocates, as the first identifying information for itself, the first identifying information that corresponds to the first frequency of the first input signal that has been output from the third communication unit, when the second input signal, that has been output from the first communication unit, has been input to the second communication unit, the second monitoring unit refers to the setting information, and allocates, as the second identifying information for itself, the second identifying information that corresponds to the second frequency of the second input signal that has been output from the first communication unit, and in a fourth case in which the second identifying information, that corresponds to the second frequency of the second input signal that has been output from the first communication unit, differs from the second identifying information that the second monitoring unit has allocated to itself, the second monitoring unit reallocates, as the second identifying information for itself, the second identifying information that corresponds to the second frequency of the second input signal that has been output from the first communication unit.

6. The battery-monitoring device according to claim 1, wherein:

the setting information associates a first number of pulses of the first input signal per unit time and the first identifying information with one another, and associates a second number of pulses of the second input signal per unit time and the second identifying information with one another, when the first input signal, that has been output from the third communication unit, has been input to the first communication unit, the first monitoring unit refers to the setting information, and allocates, as the first identifying information for itself, the first identifying information that corresponds to the first number of pulses of the first input signal per unit time, the first monitoring unit outputs, to the second monitoring unit, the second input signal having the second number of pulses per unit time that differs from the first number of pulses per unit time of the first input signal that has been output from the third communication unit, in a third case in which the first identifying information, that corresponds to the first number of pulses per unit time of the first input signal that has been output from the third communication unit, differs from the first identifying information that the first monitoring unit has allocated to itself, the first monitoring unit reallocates, as the first identifying information for itself, the first identifying information that corresponds to the first number of pulses per unit time of the first input signal that has been output from the third communication unit, when the second input signal, that has been output from the first communication unit, has been input to the second communication unit, the second monitoring unit refers to the setting information, and allocates, as the second identifying information for itself, the second identifying information that corresponds to the second number of pulses per unit time of the second input signal that has been output from the first communication unit, and in a fourth case in which the second identifying information, that corresponds to the second number of pulses per unit time of the second input signal that has been output from the first communication unit, differs from the second identifying information that the second monitoring unit has allocated to itself, the second monitoring unit reallocates, as the second identifying information for itself, the second identifying information that corresponds to the number of pulses per unit time of the second input signal that has been output from the first communication unit.

7. An identifying-information setting method comprising:

by using a first monitoring unit to monitor a first state of a first battery, when a first input signal, that has been output from a control unit, has been input to the first monitoring unit, referring to setting information, stored in a first storage unit, that is obtained by associating the first input signal and first identifying information with one another, and allocating, in the first storage unit and as the first identifying information for the first monitoring unit, the first identifying information that corresponds to the first input signal that has been output from the control unit;

by using the first monitoring unit, outputting, to a second monitoring unit, a second input signal that differs from the first input signal that has been output from the control unit;

by using the first monitoring unit in a case in which the first identifying information, that corresponds to the first input signal that has been output from the control unit, differs from the first identifying information that the first monitoring unit has allocated to itself, reallocating, as the first identifying information for the first monitoring unit, the first identifying information that corresponds to the first input signal that has been output from the control unit;

by using a second monitoring unit to monitor a second state of a second battery when the second input signal, that has been output from the first monitoring unit, has been input to the second communication unit, referring to the setting information stored in a second storage unit, and allocating, in the second storage unit and as second identifying for the second monitoring unit, the second identifying information that corresponds to the second input signal that has been output from the first monitoring unit; and by using the second monitoring unit in another case in which the second identifying information, that corresponds to the second input signal that has been output from the first monitoring unit, differs from the second identifying information that the second monitoring unit has allocated to itself, reallocating, as the second identifying information for the second monitoring unit, the second identifying information that corresponds to the second input signal that has been output from the first monitoring unit.

8. A battery-monitoring device comprising:

a first monitoring unit and a second monitoring unit to monitor states of batteries; and a control unit to communicate with the first monitoring unit by using first identifying information that has been allocated to the first monitoring unit, and to communicate with the second monitoring unit using second identifying information that has been allocated to the second monitoring unit, wherein the first monitoring unit includes a first communication unit and a first storage unit that stores setting information obtained by associating a first input signal and the first identifying information with one another, the second monitoring unit includes a second storage unit that stores the setting information, and a second communication unit connected in series to the first communication unit, the control unit includes a third communication unit connected in series to the first communication unit, when the first input signal, that has been output from the third communication unit, has been input to the first communication unit, the first monitoring unit refers to the setting information, and allocates, as the first identifying information for itself, the first identifying information that corresponds to the first input signal that has been output from the third communication unit, the first monitoring unit outputs, to the second communication unit of the second monitoring unit, a second input signal that differs from the first input signal that has been output from the third communication unit, and when the second input signal, that has been output from the first communication unit, has been input to the second communication unit, the second monitoring unit refers to the setting information, and allocates, as the second identifying information for itself, the second identifying information that corresponds to the second input signal that has been output from the first communication unit.

9. The battery-monitoring device according to claim 8, wherein:

the first monitoring unit and the second monitoring unit output, to the control unit, the first identifying information and the second identifying information, respectively, after the first monitoring unit and the second monitoring unit have allocated the first identifying information and the second identifying information for themselves, respectively, and the control unit obtains a numerical value of a total number of battery modules or monitoring units according to a number of pieces of identifying information that have been received.

10. The battery-monitoring device according to claim 8, wherein:

the setting information associates a first duty ratio of the first input signal and the first identifying information with one another, and associates a second duty ratio of the second input signal and the second identifying information with one another, when the first input signal, that has been output from the third communication unit, has been input to the first communication unit, the first monitoring unit refers to the setting information, and allocates, as the first identifying information for itself, the first identifying information that corresponds to the first duty ratio of the first input signal, the first monitoring unit outputs, to the second monitoring unit, the second input signal of the second duty ratio that differs from the first duty ratio of the first input signal that has been output from the third communication unit, and when the second input signal, that has been output from the first communication unit, has been input to the second communication unit, the second monitoring unit refers to the setting information, and allocates, as the second identifying information for itself, the second identifying information that corresponds to the second duty ratio of the second input signal that has been output from the first communication unit.

11. The battery-monitoring device according to claim 8, wherein:

the setting information associates a first frequency of the first input signal and the first identifying information with one another, and associates a second frequency of the second input signal and the second identifying information with one another, when the first input signal, that has been output from the third communication unit, has been input to the first communication unit, the first monitoring unit refers to the setting information, and allocates, as the first identifying information for itself, the first identifying information that corresponds to the first frequency of the first input signal, the first monitoring unit outputs, to the second monitoring unit, the second input signal of the second frequency that differs from the first frequency of the first input signal that has been output from the third communication unit, and when the second input signal, that has been output from the first communication unit, has been input to the second communication unit, the second monitoring unit refers to the setting information, and allocates, as the second identifying information for itself, the second identifying information that corresponds to the second frequency of the second input signal that has been output from the first communication unit.

12. The battery-monitoring device according to claim 8, wherein:

the setting information associates a first number of pulses of the first input signal per unit time and the first identifying information with one another, and associates a second number of pulses of the second input signal per unit time and the second identifying information with one another, when the first input signal, that has been output from the third communication unit, has been input to the first communication unit, the first monitoring unit refers to the setting information, and allocates, as the first identifying information for itself, the first identifying information that corresponds to the first number of pulses of the first input signal per unit time, the first monitoring unit outputs, to the second monitoring unit, the second input signal having the second number of pulses per unit time that differs from the first number of pulses per unit time of the first input signal that has been output from the third communication unit, when the second input signal, that has been output from the first communication unit, has been input to the second communication unit, the second monitoring unit refers to the setting information, and allocates, as the second identifying information for itself, the second identifying information that corresponds to the second number of pulses per unit time of the second input signal that has been output from the first communication unit.

* * * * *